United States Patent [19]

Bolle et al.

[11] 4,021,679

[45] May 3, 1977

[54] METHOD AND APPARATUS FOR AUTOMATIC SWITCHING

[75] Inventors: Fred Bolle; Chen Yi Lee; Daniel A. Tardiff, all of Troy, Mich.

[73] Assignees: Fred Bolle; Chen Yi Lee; Daniel A. Tardiff, all of Troy, Mich.; part interest to each

[22] Filed: Oct. 22, 1975

[21] Appl. No.: 625,359

[52] U.S. Cl. .................. 307/117; 340/258 C; 361/280
[51] Int. Cl.² .................................. H01H 47/12
[58] Field of Search .................. 307/117, 116; 317/DIG. 2, 146; 340/258 C, 258 R, 258 B; 240/2.13

[56] References Cited

UNITED STATES PATENTS

| | | | |
|---|---|---|---|
| 3,459,961 | 8/1969 | Ravas | 307/116 |
| 3,529,214 | 9/1970 | Corn | 307/117 |
| 3,740,567 | 6/1973 | Atkins | 340/258 C |
| 3,836,828 | 9/1974 | Siegel | 317/DIG. 2 |

*Primary Examiner*—Herman Hohauser
*Attorney, Agent, or Firm*—Cullen, Settle, Sloman & Cantor

[57] ABSTRACT

A method and apparatus for automatically switching a circuit to regulate artificial light in an area. The artificial light is turned on by a person entering the area and reflecting an ultrasonic wave pattern toward a receiver. The light is turned off by a person moving into contactless proximity of a capacitance comparison circuit which utilizes the capacitance of the human body as one of the circuit elements. The ultrasonic circuit operates at different levels of sensitivity, depending upon the existing available light in the area, such as during daylight hours. Optionally, a capacitance comparison circuit may be utilized for both turning on and turning off of the artificial light.

12 Claims, 5 Drawing Figures

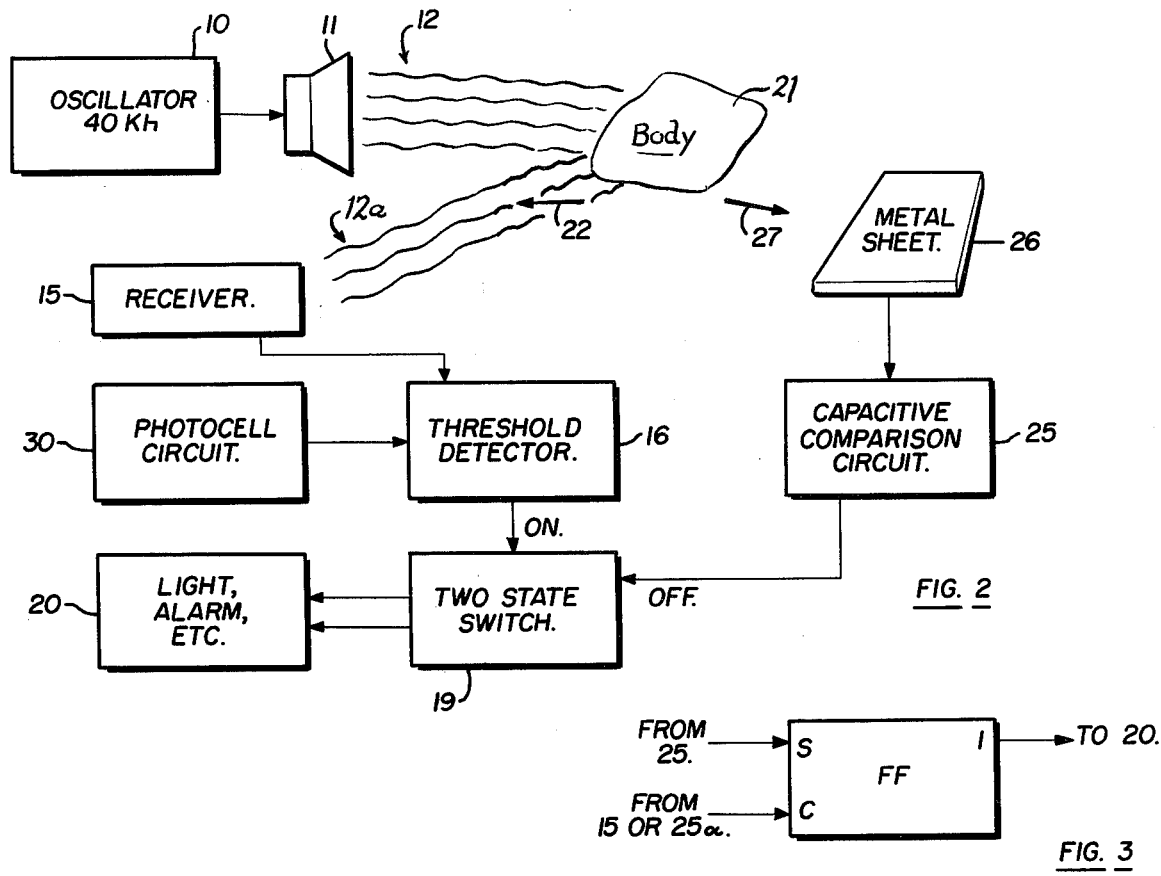
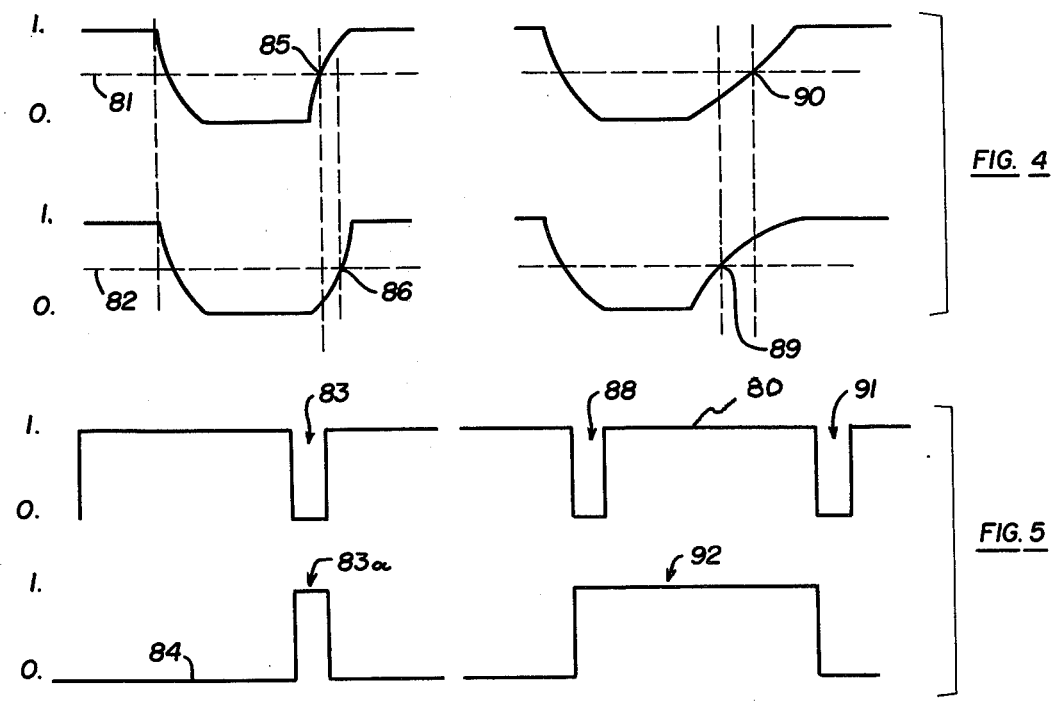

METHOD AND APPARATUS FOR AUTOMATIC SWITCHING

BACKGROUND OF THE INVENTION

This invention relates to a method and apparatus for controlling the artificial light in an area. More specifically, the present invention relates to a method and apparatus for controlling the artificial light in an area without the necessity of a person manually moving a switch.

For many years, people have been inconvenienced, when carrying packages, by the need to put the packages down in order to operate a switch to either turn the lights on or off in an area. This is particularly common when walking up or down a flight of stairs such as between the basement and the main floor in a house.

Similarly, persons with impaired vision often have to leave a night light on in a room, so that upon entering the room they can locate the light switch. Furthermore, when young children awaken during the nighttime hours, they have great difficulty in locating and manipulating conventional light switches.

Hence, the present invention is directed to a method and apparatus for controlling the artificial light in an area without the need for a person to manipulate a light switch manually.

SUMMARY OF THE INVENTION

The present invention includes an improved method and apparatus for controlling the artificial light in an area. In the and a context, the improved method of the present invention contemplates the use of ultrasonic waves and/or the capacitance of the human body. In one embodiment, an ultrasonic generator is provided and when a person enters the area, the resulting reflection of the ultrasonic wave pattern by the person's body causes the artificial light to be turned on. A dual sensitivity feature is provided so that the available light in the room is constantly monitored and the reflection of the ultrasonic wave pattern turns on the artificial light. Thus the present invention, which operates on the principle of reflected signals, should be distinguished from the conventional "burglar alarm" which operates on the principle of disturbing a constantly received signal.

A capacitance comparison circuit is provided to control the switching of the light. As a person exits from the room, the contactless proximity of the person's body, such as the hand, in the direction of the light switch introduces the capacitance of the human body into the capacitance circuit. This changes the capacitance in the circuit to switch the artificial light off.

BRIEF DESCRIPTION OF THE DRAWINGS

Various features, objects and advantages of the present invention will become more apparent upon reading the following detailed description taken in conjunction with the drawings. In the drawings, wherein like reference numerals identify corresponding components:

FIG. 2 is a diagramatic illustration of the present invention;

FIG. 3 illustrates a variation of the present invention; and

FIGS. 4 and 5 are timing diagrams illustrating the operation of the capacitance comparison circuit of the present invention.

DETAILED DESCRIPTION OF THE INVENTION

Figure 1:
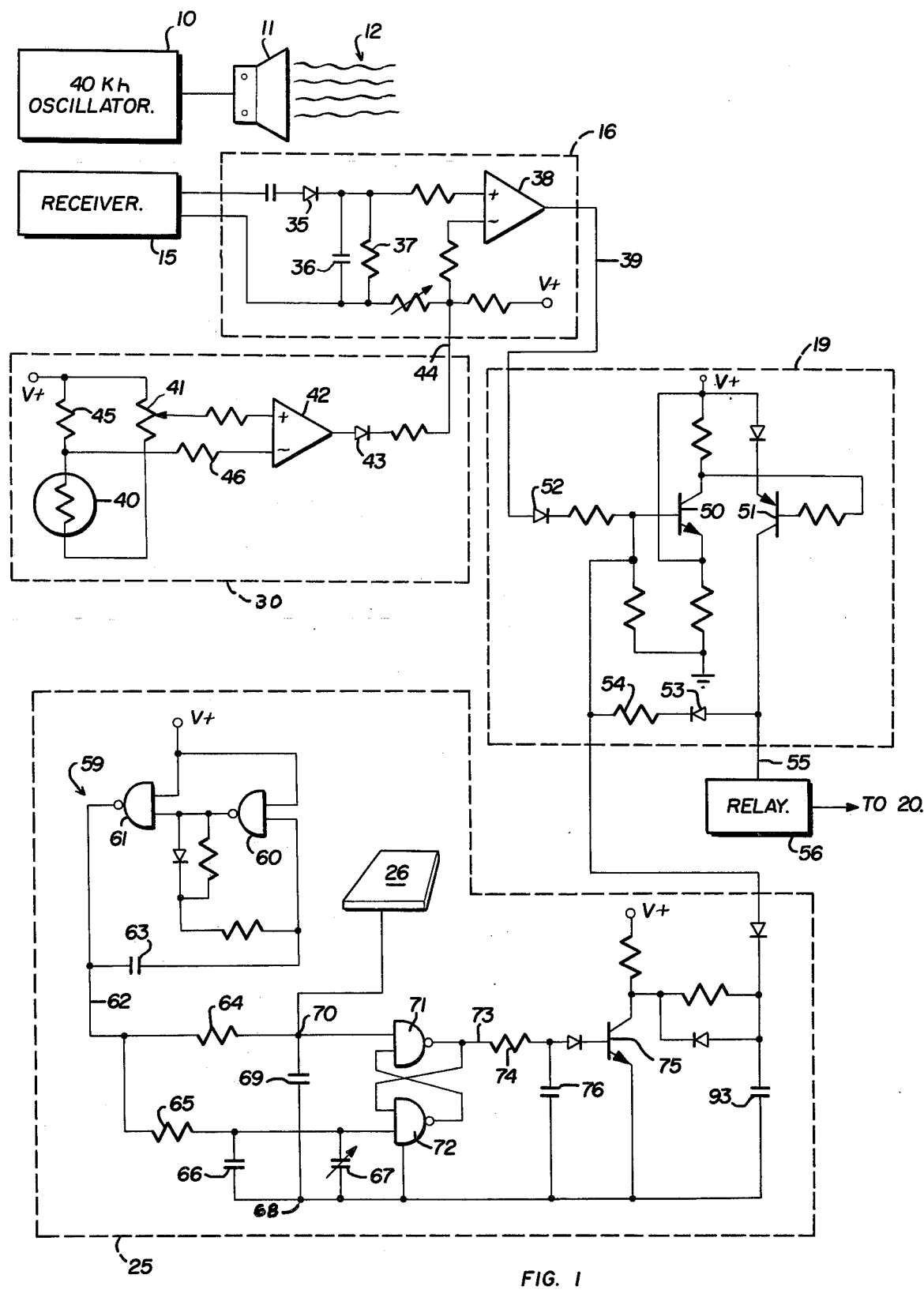
FIG. 1 is a detailed schematic diagram of the circuit of the present invention.

With reference to the drawings, and more particularly to the block drawing of FIG. 2, there is illustrated a 40-kilohertz oscillator 10 the output of which is connected to a speaker 11. The oscillator generates output signals in the ultrasonic range, as at 12. When these signals impinge on a body, they are reflected back, as at 12a, and the reflected signals are picked up by a receiver 15. The output of the receiver is connected to a threshold detector 16, the output of which is utilized to turn on a two-state switching means 19. The two-state switching means 19 controls a utilization device 20 such as a light, alarm, etc.

In operation, the oscillator 10 and receiver 15 are positioned adjacent each other in an area, such as a room, so that a moving body 21 entering the room as in the direction of the arrow 22, will reflect the ultrasonic signals 12 as at 12a, back to the receiver 15. The body 21 could be a person or an inanimate object, such as a ball thrown by a child. The reflection of the signals 12, as at 12a, is picked up by the receiver 15 and if the percent of the reflection is sufficiently great, then the threshold detector 16 permits a signal to be passed to the two-state switching means 19 to turn on the utilization device 20. If, of course, the amount of reflection is insufficient to cross the threshold level of the threshold detector 16, then the switching means and the utilization device are not actuated.

Thus, without a human manipulative step of moving a switch, it is seen that the movement of a body 21 in the direction of the arrow 22, i.e., in a direction within the range of the ultrasonic wave pattern, may turn on the lights in a room.

Means are also provided for turning off the lights without the human manipulative step of physically moving a switch. A capacitive comparison circuit 25 including a metal foil sheet 26 is provided near the entranceway to the room. Preferably the entire circuit of the present invention including the capacitive comparison circuit 25 and foil sheet 26 are enclosed in a wall box and mounted on the wall just as a conventional wall switch is mounted adjacent the entrance to a room. The capacitive comparison circuit is normally slightly unbalanced in a first direction.

As a person approaches the foil sheet (in the wall box), as indicated at 27 in FIG. 2, the capacitance of the human body is added into the circuit. This increases the capacitance in one branch of the circuit to overcome the unbalanced condition and reverse the direction of capacitive imbalance. The reversed direction of imbalance changes the state of the switching means 19 to thus turn off the utilization device 20.

The present invention also includes a photocell circuit 30 connected to the threshold detector 16 to provide a dual sensitivity feature. Specifically, the threshold detector 16 may be adjusted automatically between various threshold voltage levels based upon the output of the photocell circuit 30. Thus, if there is already sufficient light in the room such as during daylight hours, the photocell circuit 30 generates a signal raising the threshold detector level so that the movement of a body 21 in the direction of arrows 22, which reflects the ultrasonic waves toward the receiver 15, will not provide a signal sufficient to overcome the higher threshold voltage level. However, at night, the output of the photocell circuit 30 is sufficiently low so as not to raise the threshold level. Then, the threshold detector responds to the movement of the body 21 to turn on the lights.

FIG. 3 illustrates certain modifications of the principles described above. The two-state switch 19 of FIG. 2, which is described more fully hereafter, may, of course, be replaced by a two-state element such as a flipflop 31, having the one output connected to the utilization device 20. The SET terminal input receives signals from the threshold detector 16 to turn on the utilization device and the CLEAR input is utilized to turn off the utilization device.

FIG. 2 illustrates the reflection of ultrasonic waves by a body 21 to turn on the lights and a capacitive comparison circuit to turn off the lights. However, as illustrated diagramatically in FIG. 3, a capacitive comparison circuit 25 may be utilized at the SET input to the flipflop 31 to turn on the lights. Thus, the entry of a person into a room may be utilized to turn on the lights based upon the proximity of the person to the capacitive comparison circuit, thereby changing the imbalance in this circuit. Similarly, as illustrated in FIG. 3, turning off the light may be accomplished either by reflection of the ultrasonic waves at receiver 15 or by a second capacitive comparison circuit indicated as 25a.

Referring now to FIG. 1, the details of the present circuit will be explained. The oscillator 10, speaker 11 and receiver 15 are illustrated in FIG. 1 diagrammatically. These are conventional components and further details are unnecessary. For example, burglar alarm systems are available which generate ultrasonic signals or waves which are disturbed by an intruder thus causing an alarm. The output of the receiver 15 is coupled along two leads to the threshold detector circuit 16. The incoming signal from the receiver 15 is rectified by a diode 35 and filtered by a parallel capacitor 36 and resistor 37 combination to provide the average d.c. level of the a.c. signal from the receiver 15. The average d.c. level serves as the positive input to a comparator such as an operational amplifier 38. The output of the operational amplifier 38, which, in fact, is the output of the threshold detector, appears on lead 39 to trigger the two-state switching means 19.

Means are provided to operate the threshold detector at dual sensitivity levels. Specifically the photocell circuit 30 includes a conventional photocell 40 which is responsive to the amount of already available light in the area. The photocell 40 is, thus, responsive to the total amount of available light in the room including both artificial light and any natural light. In order to compensate for the varying degrees of light normally available in individual rooms, the output from the photocell 40 is taken across a variable resistor 41. Resistor 41 may be adjusted to compensate for the normal amount of light in a room. The output from the photocell is coupled to a comparator or operational amplifier 42. The output from the operational amplifier 42 passes through a diode 43 and, thence along lead 44 to the negative input of the operational amplifier 38 of the threshold detector 16.

The operation of the photocell circuit will now be explained. During daylight hours (or when there is sufficient available light in the room, such as by other artificial lights) the photocell or photoelectric device 40 has a lower resistance value and thus a low voltage appears at the negative input terminal of operational amplifier 42. The positive input terminal of amplifier 42 if fixed depending on the setting of variable resistor 41. The difference, which is high, is produced from the output of operational amplifier 42 and is carried through the diode 43 and along lead 44 to the negative input to the operational amplifier 38. Operational amplifier 38 thus has a high input at the negative terminal.

The reflected ultrasonic signal 12a impinging on receiver 15 raises the d.c. level on capacitor 36 and increases the input to the positive terminal of amplifier 38. If the positive input to amplifier 38 exceeds the negative input, a signal is conducted from amplifier 38 along lead 39 to the two-state switching means 19.

During daylight hours the output from amplifier 42 is so large as to bias operational amplifier 38 negative and preclude signals from receiver 15 from overcoming the bias. Hence no signals are generated from amplifier 38.

During the night time hours, the photocell 40 has a higher resistance value. Thus, there is no signal from amplifier 42 presented along lead 44 to the negative terminal of the operational amplifier 38 of the threshold circuit. The absence of this signal along lead 44 creates a greater or higher sinsitivity, for the detector, and reflections 12a of the signals or waves 12 provide a sufficient differential at the two inputs to the operational amplifier 38 to generate a triggering or output signal along lead 39.

The foregoing explains the dual sensitivity feature of the threshold circuit 16 and photocell circuit 30. The output signal along lead 39 is directed to a two-state switching means 19. which, in a preferred embodiment, is a conventional latch circuit including an NPN transistor 50 and a PNP transistor 51. The high signal appearing on lead 39 through a diode 52 to the base of transistor 50 turns on this transistor driving the collector of transistor 50 low. The collector of transistor 50 being low and coupled to the base of transistor 51 turns on transistor 51. This provides a feedback signal from the collector of transistor 51 through a diode 53 and resistor 54 back to the base of the transistor 50. Hence, as is conventional, once the transistor 50 conducts, this causes transistor 51 to conduct and the feedback or latching operation maintains a voltage at the base of transistor 50 and causes transistor 50 to remain in conduction. Hence, the latch stays high or on. The output of the two-state switching means 19 is, thus, high or on and appears on lead 55 to a relay 56 which is coupled to the utilization device 20 such as lights in the room.

Thus, it may be seen that during daylight hours, the lower resistance of the photocell raises the threshold level of the threshold circuit, thereby, reducing sensitivity to variations in the ultrasonic signals and such variations do not result in the utilization device 20 being turned on. In darkness, the sensitivity of the threshold circuit 16 is increased and a person entering the room and reflecting the ultrasonic waves 12 toward receiver 15 causes a signal along lead 39 which sets the latch of the two-state switching means 19 into an on or high condition, thus activating the utilization device 20.

Means are provided for turning off the lights or utilization device 20 again without the need for a person to manipulate a control switch. In a preferred embodiment, this is accomplished in a capacitive comparison circuit 25. A capacitive comparison circuit utilized in a different context is described in the copending application, Ser. No. 456,679 filed Apr. 1, 1974, in the name of one of the joint inventors of the present invention.

However, for the sake of completeness, the capacitive comparison circuit will be fully explained.

The capacitive comparison circuit 25 includes a square wave oscillator and a comparison circuit made up of two branches with the capacitance of each branch initially imbalanced in a first direction. As a person approaches the metal sheet 26, which may be copper or aluminum foil about three inches square, the capacitance in one branch is changed relative to ground. This reverses the direction of imbalance in the comparison circuit generating a signal as will be explained in greater detail.

The oscillator of the capacitive comparison circuit is preferably as astable multivibrator 59 operating at 20 hertz. This may include two NAND gates 60, 61 each having voltage applied to one input from a voltage source. The output of the astable multivibrator is a square wave on lead 62. The astable multivibrator 59 is of a common configuration with a direct connection between the NAND gates 60 and 61 and with a feedback connection from the output of one gate 61 through a feedback capacitor 63 to the input of gate 60. Functionally, when one gate provides a one output, the other provides a zero output and vise-versa, thus, generating a square wave on lead 62. The output along lead 62 is asymmetrical and has an ON/OFF ratio of about 100. The square wave output on lead 62 is fed through parallel resistors 64 and 65 to the two branches of the capacitive comparison circuit.

The capacitive comparison circuit operates to compare the value of the capacitance in the overall system. In order to establish a reference capacitance, the square wave from lead 62 passes through resistor 65 to the capacitors 66 and 67 which are connected in parallel to each other with capacitor 67 being adjustable. These parallel capacitors are tied together at a junction or terminal 68. Thus, the resistor 65 and the capacitors 66 and 67 define one branch of the cpacitive comparison circuit.

The other branch of the capacitive comparison circuit includes the resistor 64, a capacitor 69 which is connected from terminal 68 to resistor 64, and the metal sheet 26 connected to capacitor 69 and resistor 64 at terminal 70. Thus, it may be appreciated that each branch of the capacitive comparison circuit is actually an RC circuit. The change in the capacitance of one of these two circuits alters the shape or the configuration of the time-varying wave from the astable multivibrator 59. Thus, the capacitive comparison circuit operates as a slope detector or slope comparator to determine such differences in the time-varying wave.

The capacitive comparison circuit includes two NAND gates 71 and 72, each having one input supplied by the output of the other NAND gate. The second input to the NAND gate 71 is taken from terminal 70. The second input to the NAND gate 72 is taken from resistor 65. The output of the two NAND gates is also taken from NAND gate 71 along a lead 73 through a resistor 74 to the base of a transistor 75. A filtering capacitor 76 is coupled from resistor 74 to the emitter of transistor 75.

With reference to FIGS. 4 and 5, the switching of the two NAND gates will now be explained. The curve 80 represents the output from multivibrator 59. Horizontal dashed lines 81 and 82 refer to the switching levels or threshold switching voltages of gates 71 and 72, respectively.

The initial imbalanced condition is defined as capacitance 66 and 67 taken together exceeding the combined capacitance of capacitor 69 and the foil 26. As a consequence of this greater capacitance, the input to gate 72 rises and falls at a slower rate than the input to gate 71. Hence, during the first OFF time 83 the output of gate 71 goes high providing a high signal 83a on lead 73, as illustrated on curve 84 representing the output of gate 71.

The next positive going transition from multivibrator 59 causes gate 71 to again switch faster than gate 72 with gate 71 crossing the switching level at 85 and gate 72 thereafter crossing the switching level at 86, later in time than 85. Analyzing the logic signals, the output on lead 73 is normally low and goes high during pulse 83 and then low at time 85, thus, providing a spike 83a on lead 73 corresponding to the time when gate 71 is high. The spike 83a is filtered by capacitor 76 so the signal to the base of transistor 75 remains low and transistor 75 remains off.

When a person approaches foil sheet 26, the capacitance in that branch of the circuit increases and exceeds the combined capacitance of capacitors 66 and 67. This reverses the direction of imbalance of capacitance and now gate 72 will switch faster than gate 71.

During the next OFF time 88 the output of gate 72 remains high and gate 71 then goes high providing a high signal on lead 73. Then, by contrast, the next positive going transition at the end of OFF time 88 causes gate 72 to switch first at time 89, and the input to gate 71 thereafter crossing the switching level at time 90 later than time 89. Thereafter, at time 91 during on ON time of the multivibrator, gate 71 again goes low (if the person has moved away from the foil 26) and again the output on lead 73 to transistor 75 is low.

The result of the difference in switching times at the two gates 71, 72 is summarized as follows. The output of gate 71 is normally low during the ON time of the multivibrator. During the initial imbalanced condition gate 71 switches first and passes a small spike 83a during the OFF time of the multivibrator 59 but this spike is filtered by capacitor 76 so the signal on lead 73 at the base of transistor 75 remains low and transistor 75 remains biased off. When a person approches the foil 26 and reverses the direction of inbalance of capacitance, then during the next OFF time of multivibrator 59 gate 72 switches first, gate 71 goes high and remains high until the initial imbalanced condition occurs. Thus the output on lead 73 is not a small spike to be filtered by capacitor 76 but a high signal 92 to the base of transistor 75 to bias the transistor on.

Biasing on the transistor 75 causes a capacitor 93 in the emitter-collector circuit of transistor 75 to discharge completely, thus pulling the latch of the two-state switching means 19 down into a low state. This turns off the relay 56 along lead 55. Thus, the utilization device is turned off by the person approaching the metal sheet 26.

Another feature of the present invention will now be explained. It may be appreciated that as a person leaves the room and moves their hand or any portion of their body near the metal foil 26, they are also reflecting the ultrasonic waves by their motion out of the room. Thus, to avoid having the lights flicker on and off and perhaps remain in an on condition, the capacitor 93 in the capacitive comparison circuit 25 provides a delaying function. It is not until this capacitor 93 discharges completely that it is possible to reset to two-state switching means 19 back to its on state. The capacitance 93 is selected to provide a several-second discharge, thus maintaining the two-state switching means 19 in a low state for a sufficiently long time to permit the person to exit the room and move free of reflecting the ultrasonic wave pattern.

The foregoing is a complete description of the preferred embodiment of the present invention. It must be appreciated that various modifications and utilizations of the present invention are available. For example, a circuit utilizing the principles of the present invention wherein a light and/or an alarm are turned on by the imbalance of capacitance may be installed near a locked door to a house. or even on a boat. If a burglar attempts to pick the lock or determine if the door is properly secured, or boards the boat, the change in capacitance would cause an alarm to signal and, if the burglar was attempting to enter the house or board the boat in the evening, flood lights or other artificial lighting could be utilized to illuminate the area. Similarly, other utilization devices such as cameras could be automatically actuated in this fashion.

Hence, the present invention should be limited only by the spirit and scope of the following claims.

What is claimed is:

1. In the method for controlling a two-state switching means to regulate the artificial light in an area and including a capacitance comparison circuit having two branches normally capacitively imbalanced in a first direction, one branch of said capacitive comparison circuit including a metallic sheet, and including generating input signals to said capacitive comparison circuit, the improvement comprising:

changing the capacitance of said one branch of the capacitance comparison circuit by moving at least a portion of the human body into contactless proximity of the sheet;

converting said input signals into triggering signals when the capacitance in said one branch of said capacitance comparison circuit exceeds the capacitance in said other branch;

switching the two-state switching means in response to said triggering signals only when the magnitude of said triggering signals exceed a predetermined threshold; and continuously monitoring the level of existing light in said area and changing said predetermined threshold between a first level and second level, depending upon the level of existing light in said area.

2. The invention as defined in claim 1 wherein said triggering signals switch said two-state switching means into a first state for turning on said artificial light.

3. The invention as defined in claim 2 wherein said two-state switching means also is for controlling an audio alarm, said alarm being turned on when said artificial light is turned on.

4. The invention as defined in claim 1 wherein said triggering signals switch said two-state switching means into a second state for turning off said artificial light.

5. The invention as described in claim 4 and further including turning on the artificial light by generating ultrasonic signals in said area, reflecting said ultrasonic signals toward a receiver by the movement of the human body into said area, and generating a second triggering signal to switch said switching means into said first state to turn on said artificial light in response to the reflecting of said ultrasonic signals.

6. The invention as defined in claim 5 and further including the step of maintaining said two-state switching means in said second state for a predetermined time interval to allow the human body to exit said area without said artificial light being turned back on.

7. In a method for controlling a two-state switching means to regulate the artificial light in an area and including generating ultrasonic signals in said area, receiving reflected ultrasonic signals, and detecting the magnitude of output signals, the improvement comprising:

moving at least a portion of the human body into said area to reflect the ultrasonic signals;

receiving the reflected ultrasonic signals and converting the reflected signals into output signals;

switching said two-state switching means into a first state to turn on the artificial light only when the magnitude of the output signals exceeds a predetermined threshold, and continuously monitoring the level of existing light in said area and changing said predetermined threshold between a first level and a second level, depending upon the level of existing light in said area.

8. In an apparatus for controlling a two-state switching means to regulate artificial light in an area and includng an oscillator to generate ultrasonic signals and a receiver to receive the ultrasonic signals and to detect reflected ultrasonic signals, the improvement comprising a dual sensitivity threshold detector for detecting the magnitude of the output from said receiver and for generating a triggering signal to control the artificial light in the area; photoresponsive means for detecting the magnitude of illumination in the area and for generating an output signal in response thereto to control the threshold detector means; said photoresponsive means to establish first and second threshold levels based upon the level of illumination in the area, and said dual sensitivity threshold detector for generating said triggering signals to permit the artificial light to be turned on only if the magnitude of the reflected ultrasonic signals exceeds the threshold level established by the photoresponsive means.

9. The invention as defined in claim 8 and further including a capacitive comparison circuit coupled to said two-state switching means;

said capacitive comparison circuit having two branches normally capacitively imbalanced in a first direction, one of said branches including a metallic sheet;

said capacitive comparison circuit being responsive to a change in capacitance caused by moving at least a portion of the human body into the contactless proximity of said sheet for the turning off said two-state switching means to turn off the artificial light in the area.

10. The invention as defined in claim 9 and further including storage means in said capacitive comparison circuit to prevent the two-state switching means from turning the lights back until the human body moves clear of the area of the ultrasonic signals.

11. The invention as defined in claim 9 wherein, said change in capacitance reverses the direction of capacitive imbalance.

12. The invention as defined in claim 9 wherein, said capacitive comparison circuit further includes a pulse source, a first logic gate for receiving the output of said pulse source delayed by the capacitance in one of said two branches, and a second logic gate for receiving the output of said pulse source delayed by the capacitance in the other of said two branches, said logic gates being interconnected together and connected to said two-state switching means to turn off said two-state switching means only when the capacitance in said one branch including said metallic sheet exceeds the capacitance in said other branch.

* * * * *